United States Patent
Orlovskaya et al.

(10) Patent No.: US 9,926,204 B2
(45) Date of Patent: Mar. 27, 2018

(54) MECHANOCHEMICAL SYNTHESIS OF HEXAGONAL OSB$_2$

(71) Applicant: University of Central Florida Research Foundation, Inc., Orlando, FL (US)

(72) Inventors: Nina Orlovskaya, Orlando, FL (US); Zhilin Xie, Orlando, FL (US); Richard G. Blair, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 282 days.

(21) Appl. No.: 14/157,216

(22) Filed: Jan. 16, 2014

(65) Prior Publication Data

US 2014/0219902 A1  Aug. 7, 2014

Related U.S. Application Data

(60) Provisional application No. 61/753,163, filed on Jan. 16, 2013.

(51) Int. Cl.
| | |
|---|---|
| C01B 35/04 | (2006.01) |
| C30B 1/10 | (2006.01) |
| C30B 29/10 | (2006.01) |
| C04B 35/58 | (2006.01) |
| C04B 35/626 | (2006.01) |
| C04B 35/645 | (2006.01) |

(52) U.S. Cl.
CPC ........ *C01B 35/04* (2013.01); *C04B 35/58064* (2013.01); *C04B 35/6261* (2013.01); *C04B 35/645* (2013.01); *C30B 1/10* (2013.01); *C30B 29/10* (2013.01); *C04B 2235/5436* (2013.01); *C04B 2235/5445* (2013.01); *C04B 2235/5454* (2013.01); *C04B 2235/666* (2013.01); *C04B 2235/76* (2013.01); *C04B 2235/761* (2013.01); *C04B 2235/767* (2013.01); *C04B 2235/80* (2013.01)

(58) Field of Classification Search
None
See application file for complete search history.

(56) References Cited

U.S. PATENT DOCUMENTS

| | | | |
|---|---|---|---|
| 2007/0224100 A1* | 9/2007 | Kaner | B23B 27/148 423/276 |
| 2009/0274897 A1* | 11/2009 | Kaner | B24D 3/00 428/328 |

(Continued)

OTHER PUBLICATIONS

Kempter et al.; Crystallography of the Ru-B and Os-B Systems; Journal of Chemical Physics; vol. 34, No. 6; pp. 1994-1995 Jun. 1961.*

(Continued)

*Primary Examiner* — Guinever S Gregorio
(74) *Attorney, Agent, or Firm* — Dunlap Codding, P.C.

(57) ABSTRACT

The presently disclosed and/or claimed inventive concept(s) relates generally to hexagonal osmium boride, OsB$_2$, and methods of producing the same. In one non-limiting embodiment, hexagonal OsB$_2$ is produced by mechanochemical synthesis of osmium and boron in a high energy ball mill.

6 Claims, 13 Drawing Sheets

(56) References Cited

U.S. PATENT DOCUMENTS

2013/0037740 A1* 2/2013 Wakayama ............ B82Y 25/00
252/62.55
2015/0376020 A1* 12/2015 Jung ....................... C01B 35/04
428/220

OTHER PUBLICATIONS

Haines et al., "Synthesis and design of superhard materials", Annu. Rev. Mater. Res., 31, 1-23, 2001.
Chung et al., "Synthesis of ultra-Incompressible superhard rhenium diboride at ambient pressure", Science, 316, 436-439, 2007.
Aronsson, "The crystal structure of $RuB_2$, $OsB_2$, $IrB_{1.35}$ and some general comments on chemistry of borides in the composition range $MeB$-$MeB_3$," Acta. Chem. Scand., 17 (1963) 2036.
Yang et al., "Is Osmium Diboride an Ultra-hard Material", J. Am Chem. Soc., 130, 7200-7201, 2008.
Cumerland et al., "Osmium dioboride, an ultra-incompressible, hard material", J. Am. Chem. Soc., 127, 7264-7265, 2005.
Gu et al., "Transition metal borides: Superhard versus ultra-incompressible", Adv. Mater., 20, 3620-3626, 2008.
Chen et al., "Electronic and structural origin of ultra-incompressiblity of 5d transition-metal diborides $MB_2$ (M=W, Re, Os)", Phys., Rev. Lett., 100, 196403, 2008.
Ren et al., "Pressure induced structural phase transition of $OsB_2$: First principle calculations", J. Solid State Chem., 183, 915, 2010.
Hebbache et al.; A New Superhard Material: Osmium DiBoride $OsB_2$; Solid State Communications; 2006; 227-213; 139.
Dudina et al.; A Synthetic Route for Metal-Ceramic Interpenetrating Phase Composites; Materials and Letters; 2006; 3723-3726; 60.
B. Aronsson, et al. "Borides of Ruthenium, Osmium and Iridium", *Nature*, (1962) vol. 195 p. 377.
H. Y. Chung, et al. "Anisotropic Mechanical Properties of Ultra-Incompressible, Hard Osmium Diboride", *J. Mater. Res.* vol. 23, No. 6, Jun. 2008, p. 1797.
A. Šimůnek, "Anisotropy of hardness from first principles: The cases of $ReB_2$ and $OsB_2$", Phys. Rev. B 80(2009) 060103(R).
R.F. Zhang, D. Legut, R. Niewa, A.S. Argon, S. Veprek, "Shear-induced structural transformation and plasticity ultraincompressible $ReB_2$ limit its hardness"Phys. Rev. B, 82(210).
R.B. Roof and C. P. Kempter, "New orthorhombic phase in the RuB and OsB systems" J. Chem. Phys. 37(1962).
Hao, Y. Xu and F. Gao, "Electronic and elastic properties of new semiconducting $oP_{12}$-type $RuB2$ and $OsB2$", J. Phys.: Condens. Matter. 23(2011).
C. Suryanarayana: Mechanical alloying and milling. Prog. Mater. Sci. 46, 1 (2001).
V.I. Levitas, "High-pressure mechanochemistry: Conceptual multiscale theory and interpretation of experiments", Phys. Rev. B, 70(2004).
M.A. Grinfeld, "The stress driven instability in elastic crystals: mathematical models and physical manifestation", J. Nonlinear Sci., 3 (1993).
J.J. Gilman, "Shear-induced metallization", Philos. Mag. B, 71(1995).
J. J. Gilman, "Mechanochemistry", Science, 274(1996).
V.I. Levitas, "Phase transitions in elastoplastic materials: continuum thermomechanical theory and examples of control", J. Mech. Phys. Solids, 45(6)(1997).
Orlovskaya, Z. Xie, M. Klimov, H. Heinrich, D. Restrepo, R. Blair, C. Suryanarayana, "Mechanochemical synthesis of $ReB2$ powder", J. Mater. Res., 26(21)(2011).
B. H. Toby, EXPGUI, a graphical user interface for GSAS, J. Appl. Cryst. (2001).
A.C. Larson and R.B. Von Dreele, "General Structure Analysis System (GSAS)", Los Alamos National Laboratory Report LAUR 86-748 (1994).
S. J. LaPlaca and B. Post, "The crystal structure of rhenium diboride", Acta Crystallogr., 15(1962).
R. Mohammadi, A.T. Lech, M. Xie, B.E. Weaver, M.T. Yeung, S.H. Tolbert and R.B. Kaner, "Tungsten tetraboride, an inexpensive superhard material", PNAS, 108(27)(2011).
S. Chiodo, H.J. Gotsis, N. Russo and E. Sicilia, "$OsB2$ and $RuB2$, ultra-incompressible, hard materials: First-principles electronic structure calculations", Chem. Phys. Lett., 425 (2006).
A. Latini, J.V. Rau, R. Teghil, A. Generosi and V.R. Albertini, "Superhard properties of rhodium and iridium boride films", ACS Appl. Mater. Interfaces, 2(2)(2010).
M. Frotscher, M. Holzel, and B.Z. Albert: Crystal structures of the metal diborides $ReB2$, $RuB2$, and $OsB2$ from neutron powder diffraction. Z. Anorg. Allg. Chem. 636, 1783 (2010).

* cited by examiner

MECHANOCHEMICAL SYNTHESIS OF HEXAGONAL $OsB_2$

CROSS-REFERENCE TO RELATED APPLICATIONS/INCORPORATION BY REFERENCE STATEMENT

The present application claims the benefit under 35 U.S.C. 119(e) of U.S. Provisional Application Ser. No. 61/753,163, filed Jan. 16, 2013. The entirety of which is hereby expressly incorporated herein by reference.

STATEMENT REGARDING FEDERALLY SPONSORED RESEARCH OR DEVELOPMENT

A portion of this work was sponsored by NSF Career Award Number 0748364. The U.S. Government therefore has certain rights in the invention.

BACKGROUND

1. Field of the Inventive Concept(s)

The presently disclosed and/or claimed inventive concept(s) relates generally to hexagonal osmium boride, $OsB_2$, and methods of producing the same. In one non-limiting embodiment, hexagonal $OsB_2$ is produced by mechanochemical synthesis of osmium and boron in a high energy ball mill.

2. Background of the Inventive Concept(s)

Significant interest has developed over the last few decades regarding transition metal borides, such as, for example, $OsB_2$, $ReB_2$, $RuB_2$, $IrB_{1.1}$, and $WB_4$, due to their unique properties, namely ultra-high compressibility and hardness. Hardness can be defined as a measure of a material's resistance to plastic indentation under an applied load. Specifically, hardness can be defined as the maximum indentation load applied to a material divided by the corresponding contact area, which can be measured using imaging techniques like SEM or optical microscopy. See Haines et al., "Synthesis and design of superhard materials." Annu. Rev. Mater. Res., 31, 1-23, 2001, hereby expressly incorporated by reference herein in its entirety.

Chemical bonding between individual atoms determines the hardness of a material. The bond strength of a material correlates directly with both the elastic stiffness and mobility of dislocations (i.e., plastic deformation) of a material. Elastic stiffness is a measurement of the resistance of bonds to stretching and bending, wherein the resistivity to stretching is measured by the elastic bulk modulus and the resistivity to bending is measured by the shear modulus. To have a high elastic stiffness and likewise a high hardness value, both the bulk and shear moduli need to be maximized. Additionally, resistance to plastic deformation, as determined by the dislocation mobility of a material, should also be high in order for a material to have a high hardness value.

It has been known that ceramics like transition metal borides have a high hardness value, which enables them to be used in a similar manner as known "superhard" materials (i.e., materials having a hardness of at least 40 GPa, as measured by the Vickers hardness test), such as, for example, diamond and cubic boron nitride. Such properties have made transition metal borides and other ultra-hard ceramics an intriguing commodity specifically for industrial uses, for example, as coatings capable of reducing the amount of deformation and wear on various pieces of machinery including, for example but without limitation, cutting tools, blades, pistons, turbine blades, and other industrial instruments or products.

In particular, rhenium boride ($ReB_2$) and osmium boride ($OsB_2$) have received special attention due to their reportedly high valence-electron densities, which contribute to their ultra-high compressibility and hardness properties. Such properties are attributable to the presence of osmium or rhenium ions in their respective lattice structures as well as the high degree of bond covalency for the B—B bonds and Os—B or Re—B bonds in their respective $OsB_2$ and $ReB_2$ lattice structures.

Studies have determined, however, that current methods of incorporating boron into the lattice of osmium results in a lattice structure differing from the lattice structure formed when incorporating boron into the lattice of rhenium. Specifically, current methods of incorporating boron atoms into an osmium lattice cause the lattice to expand by about 10%, forming an orthorhombic Pmmm (No. 59, $oP_6$ type) structure of $OsB_2$ having lattice parameters of a=4.684 Å, b=2.872 Å, and c=4.076 Å (FIG. 1), while the incorporation of boron atoms into the interstitial tetrahedral site of rhenium causes only a 5% expansion of the original lattice, forming $ReB_2$ with a hexagonal P63/mmc (NO. 194) structure having lattice parameters of a=2.9 Å and c=7.478 Å (FIG. 2). See Chung et al., "Synthesis of ultra-Incompressible superhard rhenium diboride at ambient pressure," Science, 316 (2007), 436-439, and B. Aronsson, "The crystal structure of $RuB_2$, $OsB_2$, $IrB_{1.35}$ and some general comments on chemistry of borides in the composition range $MeB$-$MeB_3$," Acta. Chem. Scand., 17 (1963) 2036, each of which is hereby expressly incorporated herein in its entirety. The smaller expansion of the $ReB_2$ hexagonal lattice, as compared to the orthorhombic lattice of $OsB_2$, results in the Re—Re metal bonds in $ReB_2$ being shorter than the Os—Os bonds in $OsB_2$, which leads to an increased bond strength and, in turn, an increased stiffness/hardness and an overall improvement of mechanical properties for $ReB_2$, as compared to orthorhombic $OsB_2$.

Studies have also determined that although orthorhombic $OsB_2$ can withstand hydrostatic in situ compression up to around 32 to 36 GPa, orthorhombic $OsB_2$ becomes unstable under tensile or shear deformation due to the orthorhombic shape. Specifically, around 20 GPa in tension and only 9.1 GPa in shear. In contrast, hexagonal $ReB_2$ has a shear strength of about 34 GPa, much higher than the 9.1 GPa of $OsB_2$. See Yang et al., "Is Osmium Diboride an Ultra-hard Material?," J. Am. Chem. Soc., 130 (2008), 7200-7201, Cumberland et al., "Osmium diboride, an ultra-incompressible, hard material," J. Am. Chem. Soc., 127 (2005) 7264-7265, and Gu et al., "Transition metal borides: Superhard versus ultra-incompressible," Adv. Mater., 20 (2008) 3620-3626, each of which is hereby expressly incorporated herein in its entirety. The tendency for orthorhombic $OsB_2$ to become unstable and deform under shear stress is due to the Os—Os metallic bonds within the orthorhombic structure being prone to deformation under applied shear stresses, which greatly reduces the resistance of the entire $OsB_2$ structure against large shear deformation in certain easy-slip directions. As such, it was predicted that diviatoric stress could transform the crystalline structure of $OsB_2$ into a different structure with relatively little force. See Chen et al., "Electronic and structural origin of ultra-incompressibility of 5d transition-metal diborides $MB_2$ (M=W, Re, Os)," Phys. Rev. Lett., 100 (2008), 196403, and Ren et al., "Pressure induced structural phase transition of $OsB_2$: First principle calculations," J. Solid State Chem., 183 (2010) 915, each of which is hereby expressly incorporated herein in its entirety.

Chen et al. further predicted that three different crystalline structures could exist for $OsB_2$, as illustrated in FIG. 3. The first crystalline structure being the above-described orthorhombic $OsB_2$ structure (FIG. 3a). The second being a hexagonal structure similar to the above-described hexagonal $ReB_2$ structure (FIG. 3b), herein referred to as the "Hex-I" structure, and the third being a hexagonal structure similar to that of the P6/mmm lattice structure of $AlB_2$ (FIG. 3c), herein referred to as the "Hex-II" structure. Using local density calculations, Chen et al. also predicted, without specifying what type of stress would be necessary (i.e., uniaxial, hydrostatic, or shear), that it would only take 2.5 GPa of pressure to transform orthorhombic $OsB_2$ into the hexagonal "Hex-I" form of $OsB_2$—the lower compressibility of hexagonal $OsB_2$ being one of the driving forces for the pressure-induced phase transition overcoming the relatively small (~0.048 eV) potential energy difference between hexagonal $OsB_2$ and orthorhombic $OsB_2$. However, prior to the presently disclosed and/or claimed inventive concept(s), the only form of $OsB_2$ that had been synthesized was the orthorhombic crystalline structure.

Additionally, it was also predicted that a stable hexagonal form of $OsB_2$ would likely have higher bulk and shear moduli, i.e., an improved hardness, due to the shortened Os—Os bonds and less or none of the above-described structural weaknesses of the orthorhombic form of $OsB_2$. In view of the foregoing, there is a need for both the hexagonal $OsB_2$ itself, which prior to the presently disclosed and/or claimed inventive concept(s) was thought to only exist by way of mathematical calculations, and a method of producing the same.

SUMMARY OF THE INVENTIVE CONCEPT(S)

The presently disclosed and/or claimed inventive concept(s) relates generally to hexagonal osmium boride and methods of producing the same. In one non-limiting embodiment, hexagonal $OsB_2$ is produced by mechanochemical synthesis of osmium and boron in a high energy ball mill.

BRIEF DESCRIPTION OF THE DRAWINGS

FIG. 3 is a series of illustrations depicting the three different crystalline structures that could exist for $OsB_2$.

DETAILED DESCRIPTION

Figure 1:
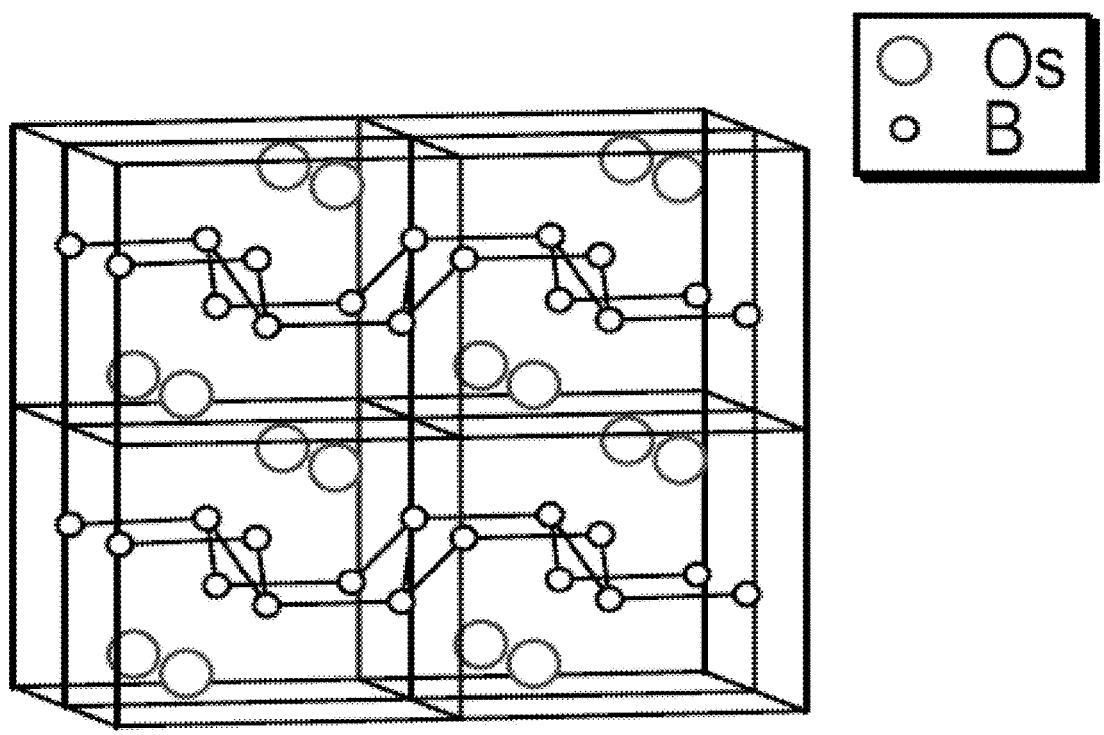
FIG. 1 is an illustration of an orthorhombic Pmmm (No. 59, $oP_6$ type) structure of $OsB_2$. The osmium atoms are the larger spheres and the boron atoms are the smaller, connected spheres.
Figure 2:
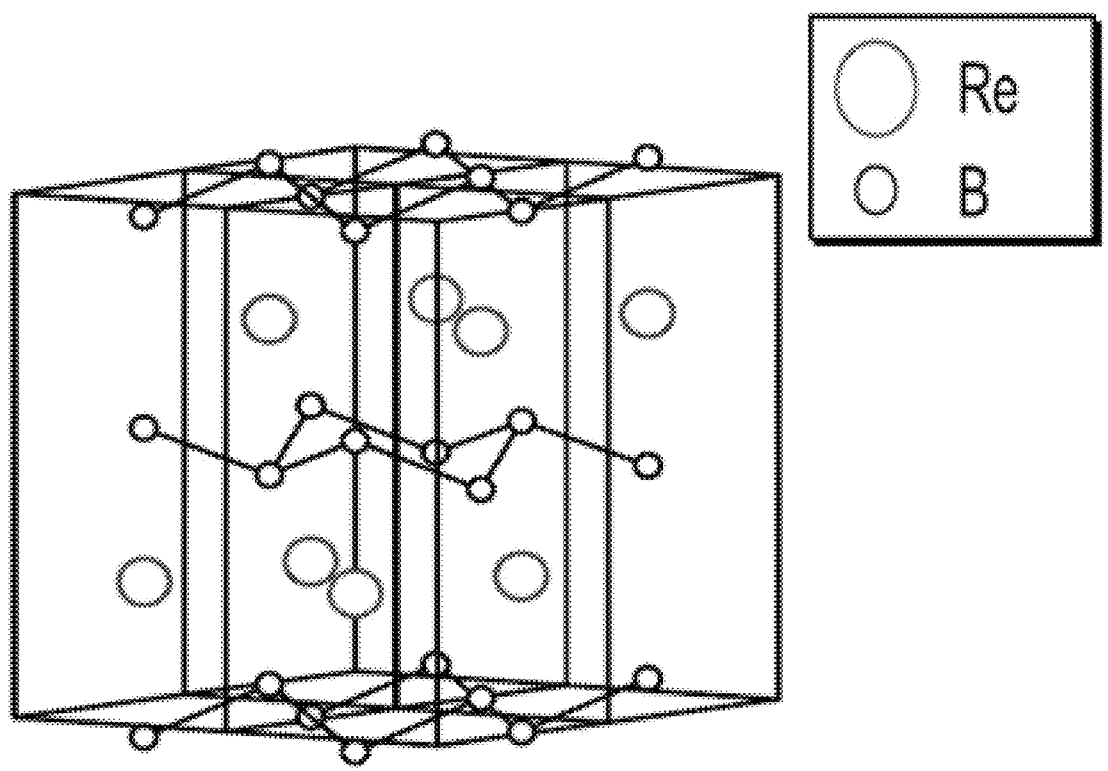
FIG. 2 is an illustration of a hexagonal $P6_3$/mmc (NO. 194) structure of $ReB_2$. The rhenium atoms are the larger spheres and the boron atoms are the smaller, connected spheres.
Figure 3B:
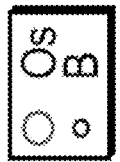
FIG. 3b represents the Hex-I structure.
Figure 3B:
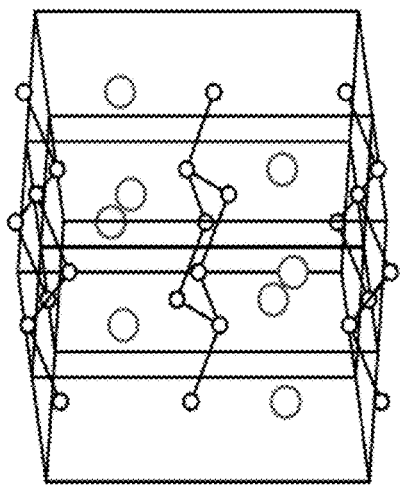
Figure 3A:
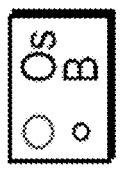
FIG. 3a represents the orthorhombic structure.
Figure 3A:
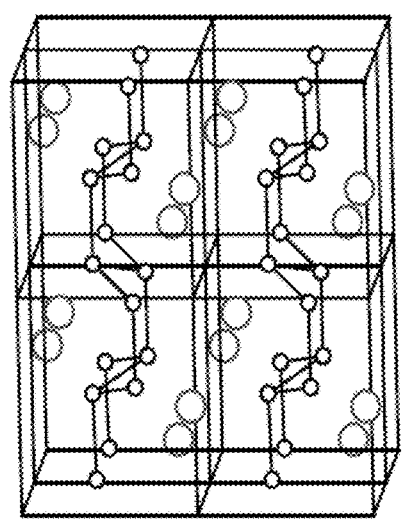
Figure 3C:
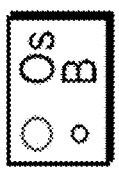
FIG. 3c represents the Hex-II structure. The osmium atoms are the larger spheres and the boron atoms are the smaller, connected spheres.
Figure 3C:
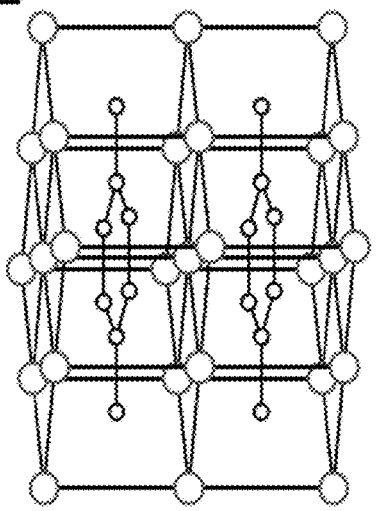

Before explaining at least one embodiment of the presently disclosed and/or claimed inventive concept(s) in detail, it is to be understood that the presently disclosed and/or claimed inventive concept(s) is not limited in its application to the details of construction and the arrangement of the components or steps or methodologies set forth in the following description or illustrated in the drawings. The presently disclosed and/or claimed inventive concept(s) is capable of other embodiments or of being practiced or carried out in various ways. Also, it is to be understood that the phraseology and terminology employed herein is for the purpose of description and should not be regarded as limiting.

Unless otherwise defined herein, technical terms used in connection with the presently disclosed and/or claimed inventive concept(s) shall have the meanings that are commonly understood by those of ordinary skill in the art. Further, unless otherwise required by context, singular terms shall include pluralities and plural terms shall include the singular.

All patents, published patent applications, and non-patent publications mentioned in the specification are indicative of the level of skill of those skilled in the art to which the presently disclosed and/or claimed inventive concept(s) pertains. All patents, published patent applications, and non-patent publications referenced in any portion of this application are herein expressly incorporated by reference in their entirety to the same extent as if each individual patent or publication was specifically and individually indicated to be incorporated by reference.

All of the articles and/or methods disclosed herein can be made and executed without undue experimentation in light of the present disclosure. While the articles and methods of the presently disclosed and/or claimed inventive concept(s) have been described in terms of preferred embodiments, it will be apparent to those of ordinary skill in the art that variations may be applied to the articles and/or methods and in the steps or in the sequence of steps of the method described herein without departing from the concept, spirit and scope of the presently disclosed and/or claimed inventive concept(s). All such similar substitutes and modifications apparent to those skilled in the art are deemed to be within the spirit, scope and concept of the presently disclosed and/or claimed inventive concept(s).

As utilized in accordance with the present disclosure, the following terms, unless otherwise indicated, shall be understood to have the following meanings.

The use of the word "a" or "an" when used in conjunction with the term "comprising" may mean "one," but it is also consistent with the meaning of "one or more," "at least one," and "one or more than one." The use of the term "or" is used to mean "and/or" unless explicitly indicated to refer to alternatives only if the alternatives are mutually exclusive, although the disclosure supports a definition that refers to only alternatives and "and/or." Throughout this application, the term "about" is used to indicate that a value includes the inherent variation of error for the quantifying device, the method being employed to determine the value, or the variation that exists among the study subjects. For example, but not by way of limitation, when the term "about" is utilized, the designated value may vary by plus or minus twelve percent, or eleven percent, or ten percent, or nine percent, or eight percent, or seven percent, or six percent, or five percent, or four percent, or three percent, or two percent, or one percent. The use of the term "at least one" will be understood to include one as well as any quantity more than one, including but not limited to, 1, 2, 3, 4, 5, 10, 15, 20, 30, 40, 50, 100, etc. The term "at least one" may extend up to 100 or 1000 or more depending on the term to which it is attached. In addition, the quantities of 100/1000 are not to be considered limiting as lower or higher limits may also produce satisfactory results. In addition, the use of the term "at least one of X, Y, and Z" will be understood to include X alone, Y alone, and Z alone, as well as any combination of X, Y, and Z. The use of ordinal number terminology (i.e., "first", "second", "third", "fourth", etc.) is solely for the purpose of differentiating between two or more items and, unless explicitly stated otherwise, is not meant to imply any sequence or order or importance to one item over another or any order of addition.

As used herein, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, un-recited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC and, if order is important in a particular context, also BA, CA, CB, CBA, BCA, ACB, BAC, or CAB. Continuing with this example, expressly included are combinations that contain repeats of one or more item or term, such as BB, AAA, AAB, BBC, AAABCCCC, CBBAAA, CABABB, and so forth. The skilled artisan will understand that typically there is no limit on the number of items or terms in any combination, unless otherwise apparent from the context.

The terms "mechanochemical synthesis" and "mechanochemical alloying", as well as derivations of such, are used herein to reference a process of strain-induced synthesis of compounds. For example, in one embodiment, mechanochemical synthesis is done in a high energy ball mill, which utilizes both strong elastic and plastic shear deformations during milling to induce solid state chemical reactions at a lower pressure.

Turning now to the presently disclosed and/or claimed inventive concept(s), a new hexagonal crystal structure for $OsB_2$ is disclosed and/or claimed herein that was previously thought to only exist in the form of a mathematical calculation. The new hexagonal $OsB_2$ can be used for a variety of applications, ranging from abrasives and cutting tools to protective coatings.

In one embodiment, the hexagonal $OsB_2$ has a crystallographic structure similar to the hexagonal structure of $ReB_2$. In a further non-limiting embodiment, the lattice parameters of the hexagonal structure of $OsB_2$ comprise: lattice constants comprising a=b, wherein a and b are in a range from about 2.90 Å to about 2.92 Å, or from about 2.905 Å to about 2.92 Å, and c, wherein c is in a range from about 7.3 Å to about 7.5 Å, or from about 7.35 Å to about 7.5 Å; angles between the lattice constants comprising $\alpha=\beta=90°$, $\gamma=120°$; and/or a $P6_3/mmc$, No. 194 space group. In another embodiment, the lattice parameters of the hexagonal structure of $OsB_2$ comprise: lattice constants comprising a=b=2.911 Å and c=7.392 Å; angles between the lattice constants comprising $\alpha=\beta=90°$, $\gamma=120°$; and a $P6_3/mmc$, No. 194 space group. In yet another embodiment, the lattice parameters of the hexagonal structure of $OsB_2$ comprise: lattice constants comprising a=b=2.9047 Å and c=7.450 Å; angles between the lattice constants comprising $\alpha=\beta=90°$, $\gamma=120°$; and a $P6_3/mmc$, No. 194 space group. In one embodiment, the hexagonal $OsB_2$ is in the form of a powder. In another non-limiting embodiment, the hexagonal $OsB_2$ is in a sintered bulk form of hexagonal $OsB_2$, wherein the hexagonal $OsB_2$ in a sintered bulk form has lattice constants comprising a=b=2.916 Å and c=7.376 Å. In another non-limiting embodiment, the lattice parameters of the hexagonal structure of $OsB_2$ in a sintered bulk form comprise: lattice constants comprising a=b, wherein a and b are in a range from about 2.90 Å to about 2.92 Å, or from about 2.905 Å to about 2.92 Å, and c, wherein c is in a range from about 7.3 Å to about 7.5 Å, or from about 7.35 Å to about 7.5 Å; angles between the lattice constants comprising $\alpha=\beta=90°$, $\gamma=120°$; and/or a $P6_3/mmc$, No. 194 space group. The powdered hexagonal $OsB_2$ comprises nanoparticles having a diameter of from about 1 to about 20 nm, or from about 1 to about 15 nm, or from about 1 to about 10 nm. The powdered hexagonal $OsB_2$, however, has a tendency to agglomerate such that the powdered hexagonal $OsB_2$ comprises agglomerates of the above-described particles having diameters of less than about 100 μm, or less than about 50 μm, or less than about 30 μm, or less than about 10 μm.

In an alternative embodiment, the hexagonal $OsB_2$ is in the sintered bulk form, wherein the powdered hexagonal $OsB_2$ undergoes densification by sintering the hexagonal $OsB_2$ powder. In one embodiment, the hexagonal $OsB_2$ powder undergoes Spark Plasma Sintering at 1550° C. and 50 MPa of pressure for 5 minutes to form sintered $OsB_2$, wherein the sintered $OsB_2$ comprises at least 80% by volume of hexagonal $OsB_2$ and at most 20 wt % by volume of orthorhombic $OsB_2$. The bulk form of hexagonal $OsB_2$ has a diameter in a range of from about 0.5 cm to about 5 cm, or from about 1 cm to about 4 cm, or from about 1 cm to about 3 cm, and a thickness of from about 0.2 to about 1 cm, or from about 0.3 to about 0.8 cm, or from about 0.4 cm to about 0.8 cm after sintering.

Additionally, as further described in the examples below, in one embodiment, the hexagonal $OsB_2$ has a hardness value of about 52±4 GPa and a Young's modulus in a range of from about 561±38 GPa to about 585±42 GPa, as calculated by Oliver and Pharr's method from a load-displacement plot produced by a spherical indentor having a radius of 0.222 μm and a nanoindentation loading of 8 mN, and also using a Poisson ratio of either 0.18 or 0.27 to calculate the Young's modulus. In a further non-limiting embodiment, the above-described hardness and Young's modulus measurements have a standard deviation of about 10%.

In another embodiment, and also further described in the examples below, the hexagonal $OsB_2$ has an estimated hardness value of about 34 GPa when calculated using the standard definition of hardness, i.e., dividing an applied load by its indentation contact area, wherein the applied load is provided by a spherical indentor having a radius of 0.222 μm. In a further embodiment, the indentation contact area can be measured from SEM micrographs. In another non-limiting embodiment, the estimated hardness of hexagonal $OsB_2$ is calculated by applying a force of 8 mN to a sintered form of hexagonal $OsB_2$, wherein the force is applied by a spherical indentor having a radius of 0.222 μm and the indentation contact area, as measured by SEM micrographs, is the area of a circle having a diameter of approximately 543.6 nm.

The above-described powdered hexagonal $OsB_2$ having a $P6_3/mmc$, No. 194 space group also retains its hexagonal structure at high temperatures. In one embodiment, the above-described powdered hexagonal $OsB_2$ having a $P6_3/mmc$, No. 194 space group retains its structure after annealing the hexagonal $OsB_2$ powder at a temperature of at least 1050° C. in vacuo for at least 6 days. In another embodiment, above-described powdered hexagonal $OsB_2$ having a $P6_3/mmc$, No. 194 space group maintains its structure at a temperature in a range of from about −223° C. to about 875° C. In yet another embodiment, the above-described powdered hexagonal $OsB_2$ having a $P6_3/mmc$, No. 194 space group maintains its structure at a temperature in a range from of about −223° C. to about 875° C., wherein the unit cell volume decreases at a temperature in a range of from about 300 to about 500° C., indicating a negative thermal expansion of the hexagonal $OsB_2$ between the above-described temperature range. More specifically, in one non-limiting embodiment, the a lattice parameter of the above-described powdered hexagonal $OsB_2$ having a $P6_3/mmc$, No. 194 space group decreases in value at a temperature in a range of from about 300 to 500° C., resulting in negative thermal expansion within the recited temperature range.

The presently disclosed and/or claimed inventive concept(s) is also directed to a method of making hexagonal $OsB_2$, where in one non-limiting embodiment, the hexagonal $OsB_2$ has lattice constants comprising a=b, wherein a and b are in a range from about 2.90 Å to about 2.92 Å, or from about 2.905 Å to about 2.92 Å, and c, wherein c is in a range from about 7.3 Å to about 7.5 Å, or from about 7.35 Å to about 7.5 Å; angles between the lattice constants comprising $\alpha=\beta=90°$, $\gamma=120°$; and/or a $P6_3/mmc$, No. 194 space group. In another embodiment, the presently disclosed and/or claimed inventive concept(s) is directed to a method of making hexagonal $OsB_2$ lattice parameters comprising lattice constants of a=b=2.9047 Å and c=7.4500 Å; angles between the lattice constants comprising $\alpha=\beta=90°$, $\gamma=120°$; and a $P6_3/mmc$ s pace group. In an alternative embodiment, the presently disclosed and/or claimed inventive concept(s) is directed to a method of making hexagonal $OsB_2$ having lattice parameters comprising lattice constants of a=b=2.911 Å and c=7.392 Å; angles between the lattice constants comprising $\alpha=\beta=90°$, $\gamma=120°$, and a $P6_3/mmc$ space group.

The method of making the above-described hexagonal $OsB_2$ comprises the step of mechanochemically reacting osmium and boron. In one embodiment, the osmium and boron are reacted in a high energy ball mill, wherein the ball mill comprises a container comprised of tungsten carbide and milling media comprised of tungsten carbide. The milling media can comprise at least two balls. In another embodiment, the osmium and boron are reacted in a high energy ball mill, wherein the ball mill comprises a container comprised of tungsten carbide and at least two balls comprised of tungsten carbide having diameters of about 12.7 mm. In another embodiment, the container and milling media can comprise a hard metallic and/or ceramic material capable of milling osmium and boron with minimal damage to the media during the media process. In yet another embodiment, the osmium and boron can be reacted in any milling apparatus or otherwise that provides the requisite forces to mechanochemically react the osmium and boron to produce hexagonal $OsB_2$.

In one embodiment, the method of forming hexagonal $OsB_2$ comprises the step of mechanochemically reacting osmium and boron, wherein the osmium and boron are in the form of powders and wherein the osmium powder and boron powder are mechochemically reacted for at least 2 hours, or at least 15 hours, or at least 20 hours. The osmium powder and boron powder can be added, in one non-limiting embodiment, at a molar ratio in a range of from about 1:2 to about 1:3, or from about 1:2.5 to 1:3, or from about 1:2.7 to 1:3 osmium powder to boron powders. In one embodiment, the amount of osmium and boron powders is added at about a 5:1 weight ratio, or about a 4:1 weight ratio, or about a 3:1 weight ratio, or about 2.7:1 weight ratio of the balls in the ball mill to the osmium and boron powders.

The presently disclosed and/or claimed inventive concept(s) is also directed to a method of producing a bulk form of the above-described hexagonal $OsB_2$ powder comprising the step of sintering the above-described hexagonal $OsB_2$ powder. In one embodiment, the hexagonal $OsB_2$ is sintered by high temperature Spark Plasma Sintering at a temperature of at least 1550° C. and at a pressure of at least 50 MPa for about 5 minutes. The process of sintering the hexagonal $OsB_2$ powder reduces the porosity of the powder, densifying the powder into a bulk, or solid, object comprising the hexagonal $OsB_2$. In another embodiment, the hexagonal $OsB_2$ is sintered by high temperature Spark Plasma Sintering at a temperature of 1550° C. and at a pressure of 50 MPa for about 5 minutes. In yet another embodiment, the hexagonal $OsB_2$ is sintered by high temperature Spark Plasma Sintering at a temperature in a range of from about 1400 to about 1450° C. and at a pressure of at least 70 MPa for about 3 minutes.

EXAMPLES

Examples are provided herein below. However, the presently disclosed and/or claimed inventive concept(s) is to be understood to not be limited in its application to the specific experimentation, results, and laboratory procedures disclosed herein below. Rather, the Examples are simply provided as one of various embodiments and are meant to be exemplary and not exhaustive.

The following examples were carried out by mechanochemical synthesis of elemental powder compounds. Specifically, the examples are directed to the mechanical synthesis of powdered $OsB_2$ from powdered osmium and boron. During the mechanochemical synthesis process, chemical reactions occur between the reactants by deforming the reactants through cold welding, fracturing, and re-welding the reactant particles in a ball mill apparatus. The mechanochemical synthesis is able to occur at or near room temperature, especially when the reactants are in powder form, as a result of the high diffusivity of the particles, low diffusion distances, and increased density of crystalline defects as a result of, for example, ball milling the reactants in a closed container. Large strain on the reactants brings together the highest occupied molecular orbital and the lowest unoccupied molecular orbital to close the gap there between, after which the bonding electrons delocalize into anti-bonding states causing the activation energy for the reaction to fall close to zero. Additionally, localized frictional heating provides the required thermal energy to lower the activation barrier for the hexagonal form of $OsB_2$ while avoiding dramatic temperature rises from the localized high pressure/high shear interactions. This is because the only heat present in the reaction is provided by reaction enthalpies, which are favored for the reactions involved in mechanically synthesizing $OsB_2$ from osmium and boron-rich solids. On average, a ball mill for mechanochemically synthesizing $OsB_2$ from osmium and boron-rich solids is extremely energy efficient, requiring approximately only 100 W of power to produce ten grams of material.

Figure 4A:
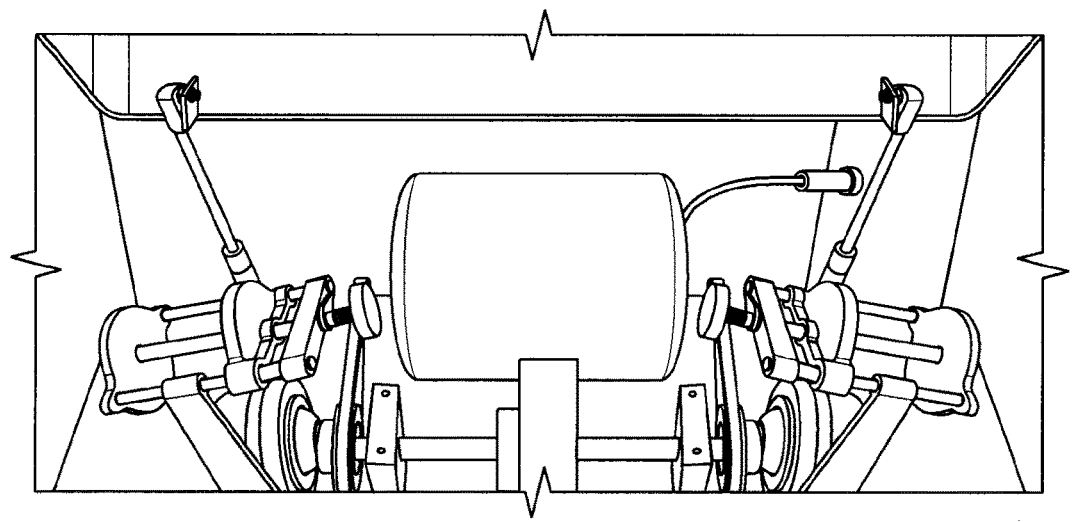
FIG. 4 is an image of the ball mill apparatus (FIG. 4a) used herein and its accompanying milling vial and media (FIG. 4b).
Figure 4B:
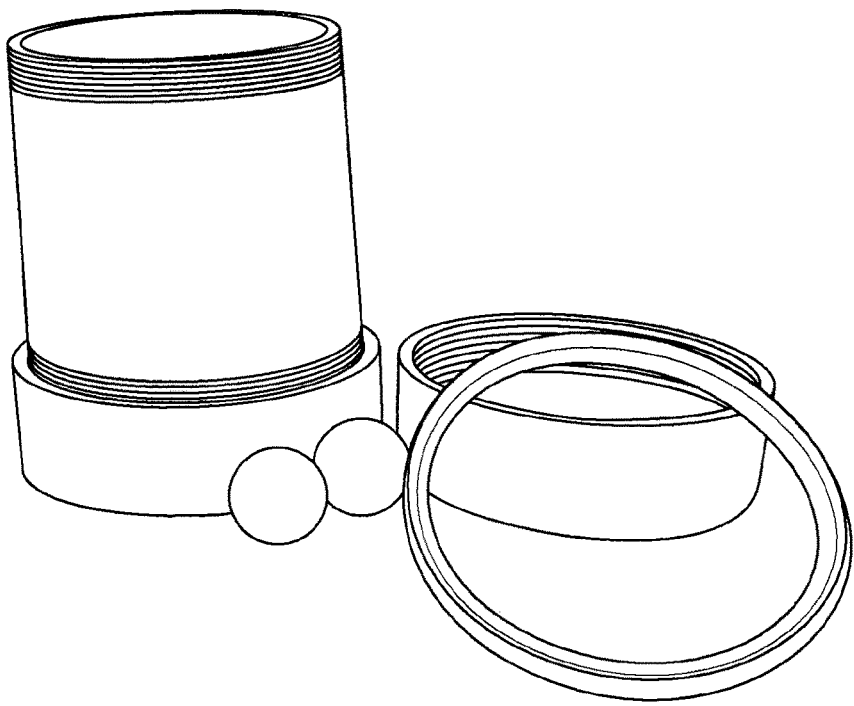

Osmium metal powder (99.95% pure, Heraeus, South Africa) and boron powder (99% pure, −325 mesh, Alfa Aesar) were used for mechanochemical synthesis of hexagonal $OsB_2$. Both Os and B powders (molar ratio 1:3) were loaded into a vial for a SPEX 8000D ball mill (FIG. 4) comprising tungsten carbide along with two 12.7 mm tungsten carbide balls with a ball to powder weight ratio was 4:1. All loading operations were carried out in an argon-filled glovebox. The vials were sealed with Viton gaskets to reduce oxygen contamination during milling. The milling was performed in the SPEX 8000D ball mill for a total of 33 hours. Every 30 minutes the milling was interrupted and vials dwelled for 30 minutes without grinding in order to decrease the vial's temperature and reduce wear on the mill's motor. After every two hours of milling, a small amount of sample powder was removed from the vial for X-ray diffraction (XRD) analysis. A Rigaku® (Tokyo, Japan) D/MAX X-Ray Diffractometer with a copper source (Cu $K_{\alpha I}$=1.5418 Å) was used to record the powder XRD patterns (FIG. 5).

Figure 5:
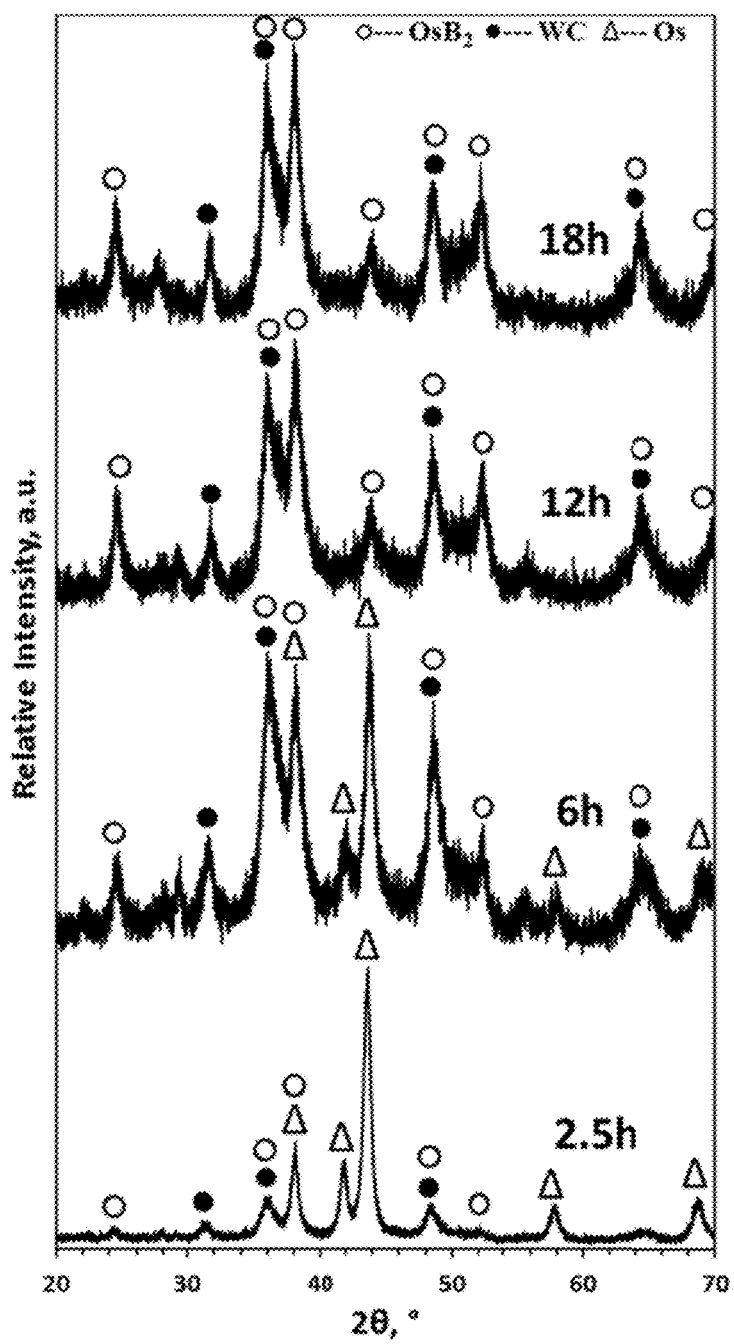
FIG. 5 is a graphical representation of the XRD patterns measured for a 1:3 Os and B mixture after different milling times as indicated in the figure.

After the first 2.5 hours of grinding, a group of peaks, which do not correspond to the orthorhombic $OsB_2$ structure, are evident in the XRD patterns, as illustrated in FIG. 5. However, the reaction was not complete since elemental Os peaks were still prevalent in the XRD diffractogram at 2.5 hours. After milling for 6 hours, the intensities of peaks corresponding to hexagonal $OsB_2$ began to dominate the diffractogram (see FIG. 5). After 8 hours of milling, the amount of crystalline Os metal phase decreased drastically with the Os peaks becoming almost undetectable after 12 hours of grinding (see FIG. 5). Lastly, after 18 hours of milling, $OsB_2$ became the major phase, with some contamination from the tungsten carbide of the milling apparatus, as identified in the diffractogram in FIG. 5.

Figure 6:
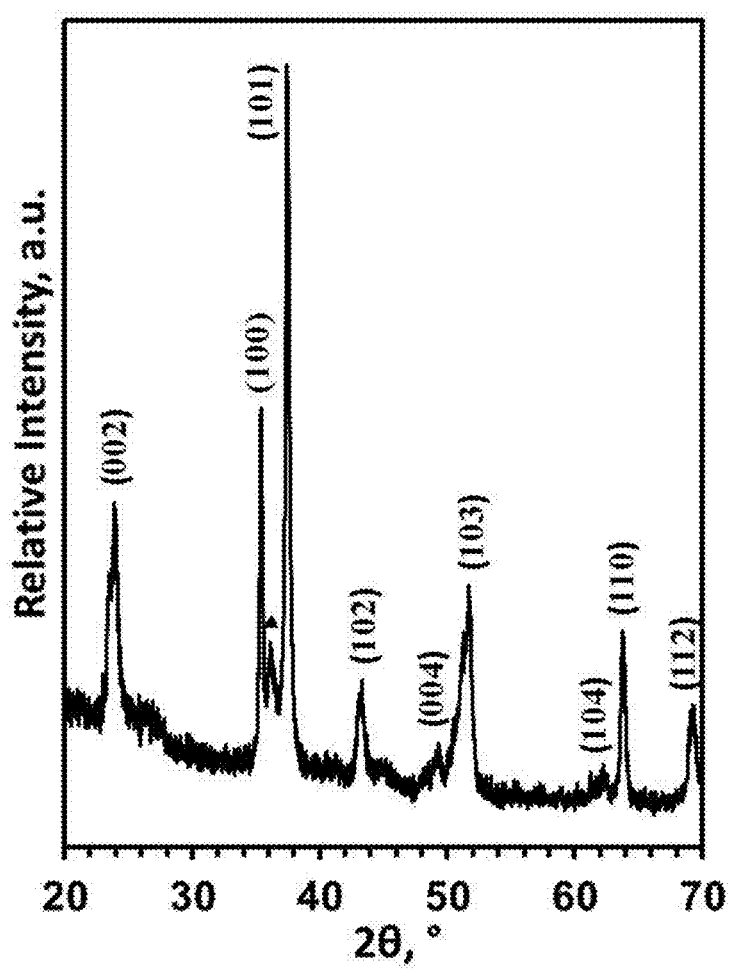
FIG. 6 is a graphical representation of the XRD pattern of hexagonal $OsB_2$ produced by ball milling of Os and B for 20 hours and annealing for 6 days at 1050° C. Crystallographic orientation planes are indexed. The unindexed peak around $2\theta=36°$ (▲) may be due to $Os_2B_3$.

In a second example, the above-described experimental method was used, changing only the ball to powder weight ratio to a ratio of 2.7:1 so that little to no tungsten carbide contamination was detected by XRD analysis after 20 hours of milling. In order to improve crystallinity and remove strain induced during the mechanochemical synthesis, a small quantity of hexagonal $OsB_2$ was annealed by loading the hexagonal $OsB_2$ powder into a fused silica ampule, sealed under vacuum, and heated for 6 days at 1050° C. After annealing, a Rigaku® (Tokyo, Japan) D/MAX X-Ray Diffractometer with a copper source (Cu $K_{\alpha I}$=1.5418 Å) was once again used to record the XRD patterns. The XRD pattern (FIG. 6) suggested that the $OsB_2$ powder maintained its hexagonal structure after annealing without transforming into the orthorhombic phase, which in turn suggests the relatively high stability of hexagonal $OsB_2$. Additionally, the crystallinity of each phase present in annealed hexagonal $OsB_2$ increased, as would be expected after high-temperature annealing of a nanocrystalline powder. Rietveld refinement of the structure was performed on an XRD pattern obtained from the annealed sample using EXPGUI and GSAS software available from Argonne National Laboratory. From the Rietveld refined pattern, the lattice parameters were obtained for $OsB_2$ powder, confirming that the $OsB_2$ formed indeed had a hexagonal lattice structure, as well as a small amount of $Os_2B_3$ byproduct (as indicated by the triangle in FIG. 6). Table 1 lists the lattice parameters of the mechanochemically produced hexagonal $OsB_2$ in addition to the lattice parameters for $ReB_2$ (PDF #00-011-0581) and the predicted hexagonal $OsB_2$ lattice parameters.

TABLE 1

| Lattice Parameter Data Source | a (Å) | c (Å) | c/a ratio |
| --- | --- | --- | --- |
| Mechanochemically synthesized hexagonal $OsB_2$ | 2.905 | 7.450 | 2.565 |
| $ReB_2$ | 2.900 | 7.478 | 2.579 |
| Theoretical Calculation for hexagonal $OsB_2$ | 2.941 | 7.338 | 2.495 |

Figure 7:
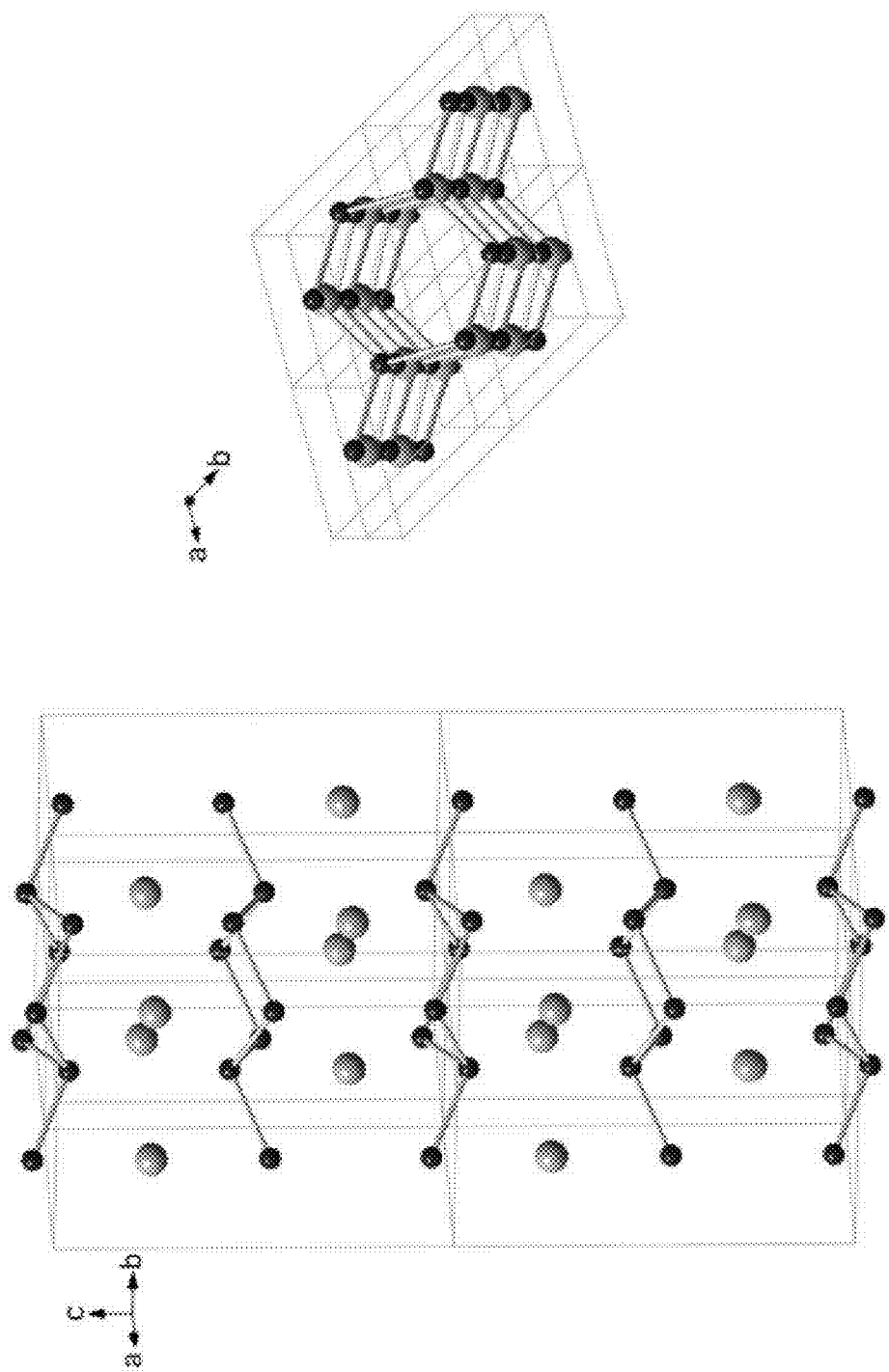
FIG. 7 is an illustration of the crystal structure of hexagonal $OsB_2$ as produced by mechanochemical synthesis. The osmium atoms are the larger spheres and the boron atoms are the smaller, connected spheres.

As illustrated by Table 1, the $OsB_2$ presently disclosed and/or claimed inventive concept(s) herein have a hexagonal lattice similar, but not the same as the hexagonal lattice structure of $ReB_2$ or the theoretically calculated hexagonal $OsB_2$. The structure of the synthesized hexagonal $OsB_2$ unit cell based on the measured lattice parameters is shown in FIG. 7.

Small variations, however, are inherent in the measured values of lattice parameters due to diffractometers, including diffractometers of the same X-ray brand, producing slightly different XRD patterns for the same experimental sample. Expected deviations may therefore result from the fact that lattice parameters cannot be read directly from XRD results and require simulations and refinement of the XRD patterns to obtain the lattice constants. The material itself also could have some variations which may lead to slight deviations in the measured value of the lattice constants. For example, sintered hexagonal $OsB_2$ has slightly different lattice constants than the hexagonal $OsB_2$ prior to sintering. There are many other factors too that could impact the measured lattice parameters, including the temperature during the XRD measurement, the particle size of the powder, powder film roughness and height, etc. As such, a second XRD pattern was obtained for the hexagonal $OsB_2$ sample described above, which was assessed to comprise lattice parameters of a=b=2.911 Å and c=7.392 Å. Thus, it was determined that the lattice parameters for hexagonal boron can comprise: a=b, wherein a and b are in a range from about 2.90 Å to about 2.92 Å, or from about 2.905 to about 2.92 Å, and c, wherein c is in a range from about 7.3 Å to about 7.5 Å; angles between the lattice constants comprising α=β=90°, γ=120°; and/or a P6$_3$/mmc, No. 194 space group.

Figure 8:
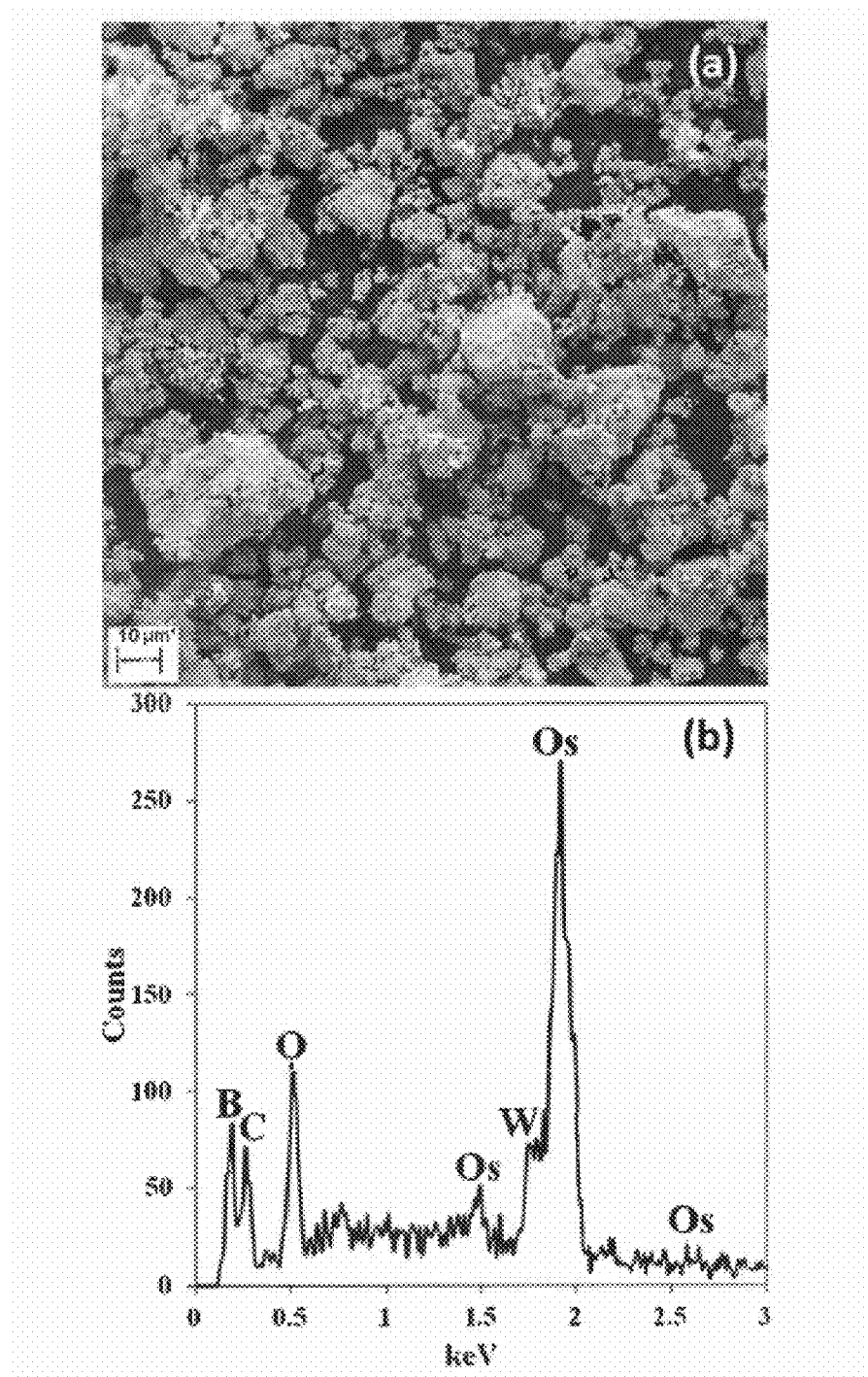
FIG. 8 is a SEM micrograph image of synthesized hexagonal $OsB_2$ (FIG. 8a) and a graphical representation of the energy dispersive X-ray spectroscopy (EDS) (FIG. 8b) for the synthesized hexagonal $OsB_2$ powder produced after 18 hours of milling, demonstrating the presence of boron, carbon, oxygen, osmium, and tungsten in the hexagonal $OsB_2$ powder.

The morphology and grain size of the powders were examined in a Zeiss® (Jena, Germany) ULTRA-55 FEG scanning electron microscope (SEM) equipped with an energy dispersive X-ray spectroscopy (EDS) detector. The irregular shape and size of the agglomerates can also be seen in an SEM image of the powder after 18 hours of milling, as depicted in FIG. 8a. Most of the agglomerates are smaller than 10 μm, although some of the agglomerates did exceed 30 μm in effective diameter. However, the average size of the agglomerates after milling is much smaller than the original particle size of the Os powder, which was measured to be 44 μm before milling. EDS analysis also confirmed the presence of Os, B, W, and C, as well as some oxygen in the hexagonal OsB$_2$ powder composition after 18 hours of milling (see FIG. 8b).

Figure 9:
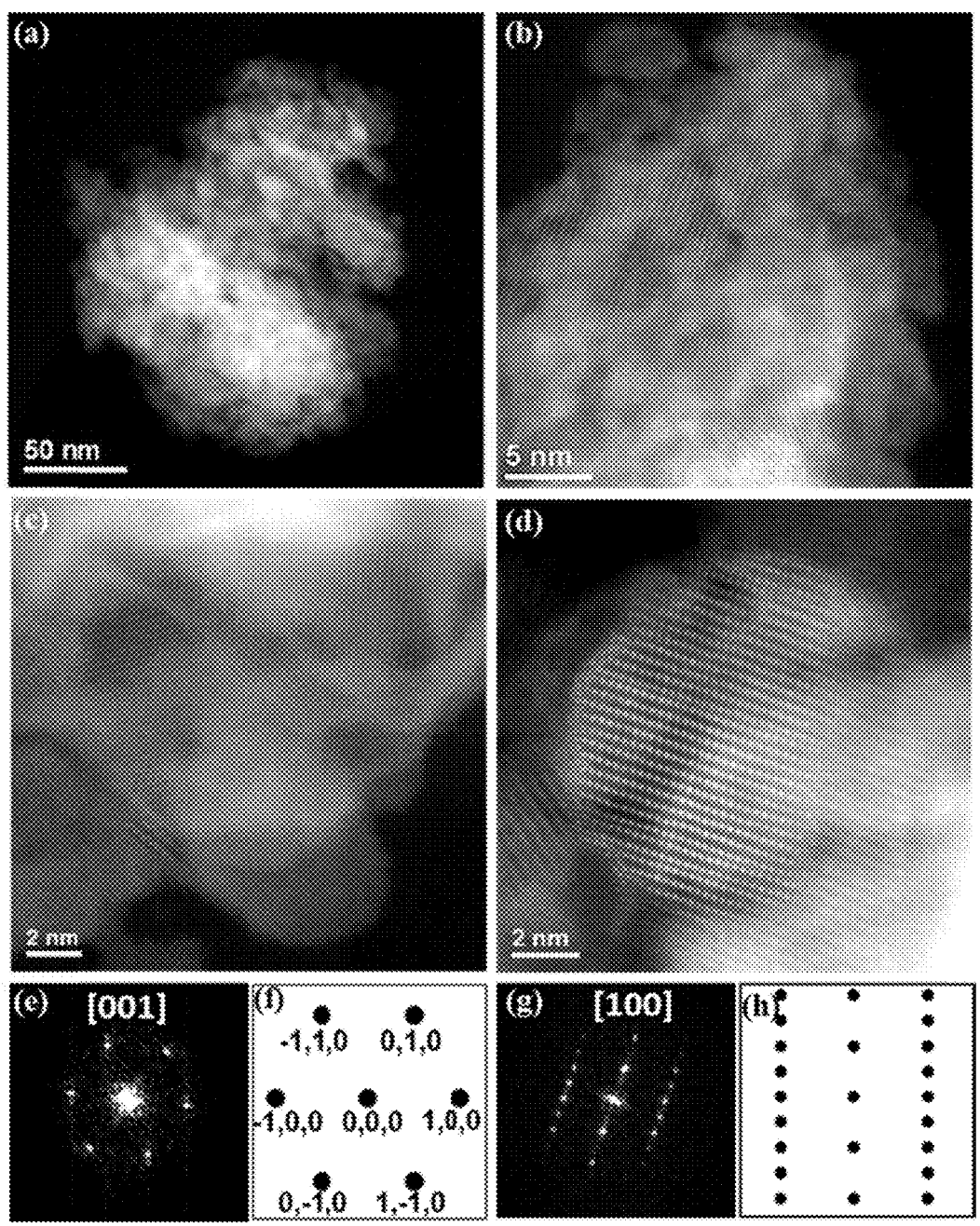
FIG. 9 is a series of HAADF-STEM images of $OsB_2$ powder (FIGS. 9a, 9b) and individual $OsB_2$ nanocrystallites (FIGS. 9c, 9d) with corresponding fast Fourier transforms (FIGS. 9e, 9g), and simulated diffraction patterns (FIGS. 9f, 9h).

A JEOL® (Tokyo, Japan) JEM2200FS aberration-corrected scanning transmission electron microscope (STEM) was also used to obtain high-resolution images of the hexagonal OsB$_2$ nanoparticles and study the atomic arrangement of the hexagonal OsB$_2$ powder. Characteristic high-angle annular dark-field (HAADF) images of OsB$_2$ particles are presented in FIG. 9. By sonicating the powder in methanol for 1 min, the larger agglomerated particles were broken down into smaller aggregates of 100-500 nm in size, as shown in FIG. 9a. These aggregates were made up of nanocrystallites ranging in size from 1 to 10 nm (FIG. 9b). High-resolution STEM images of OsB$_2$ nanocrystallites aligned along the major zone axes are presented in FIG. 9c and FIG. 9d, with the corresponding fast Fourier transform (FFT) presented and simulated diffraction patterns in FIG. 9e-h. FIG. 9c presents OsB$_2$ nanocrystallites aligned along the [001] direction, and FIG. 9d presents other OsB$_2$ nanocrystallites aligned along the [100] direction. Diffractograms of both particles match those of hexagonal OsB$_2$ phase.

Figure 10:
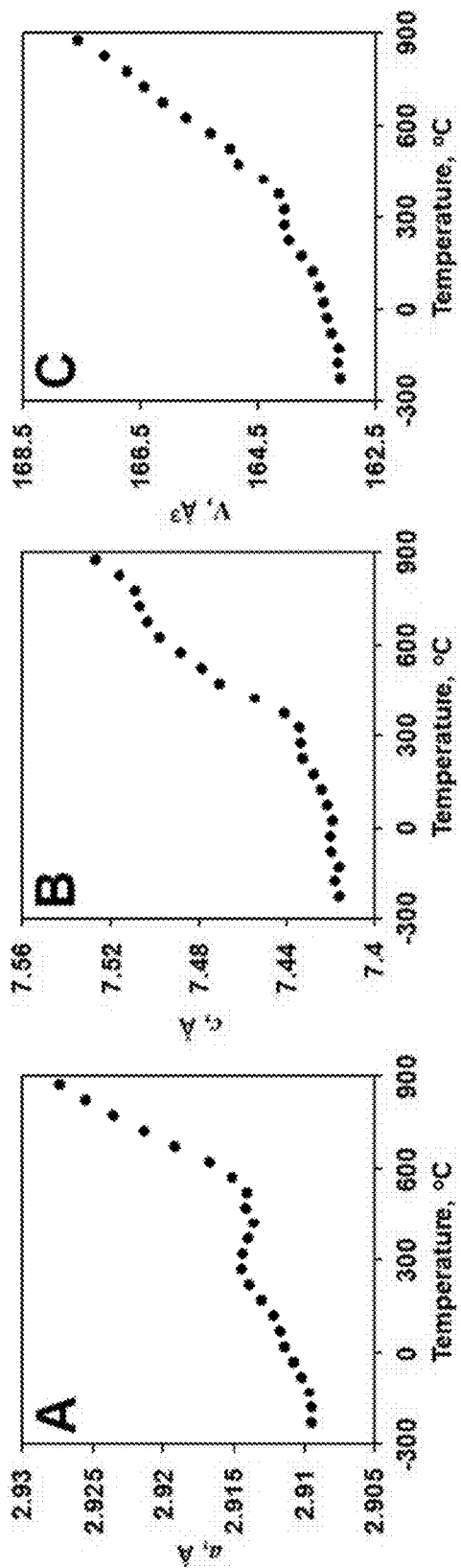
FIG. 10 is a series of graphical representations of lattice parameters and unit cell volume of hexagonal $OsB_2$ as a function of temperature.

Additionally, in order to verify the phase stability of the hexagonal OsB$_2$ structure, the OsB$_2$ powder was exposed to temperatures in a range between −223° C. and 25° C. in vacuo and temperatures in a range between 25° C. and 875° C. in an argon atmosphere. An X'PERT-PRO Diffractometer system from PANanlytical (Almelo, Netherlands) was used to collect high and low temperature in situ XRD patterns. A change in a and c lattice parameters and unit cell volume as a function temperature are presented in FIG. 10. It was determined that the hexagonal OsB$_2$ structure is stable within the entire −223° C. to 875° C. temperature range both upon cooling and heating. While there is a clear trend for an increase in the lattice parameters as the temperature rises, the a lattice parameter showed a decrease in value, indicating a negative thermal expansion of the compound in the a crystallographic direction in the 300° C. to 500° C. temperature range. Such a negative thermal expansion indicates that if the hexagonal OsB$_2$ were coated on a substrate, then very low or almost no thermal residual stresses would appear in between the coating and substrate, thereby increasing the stability and reliability of the structure.

Figure 11:
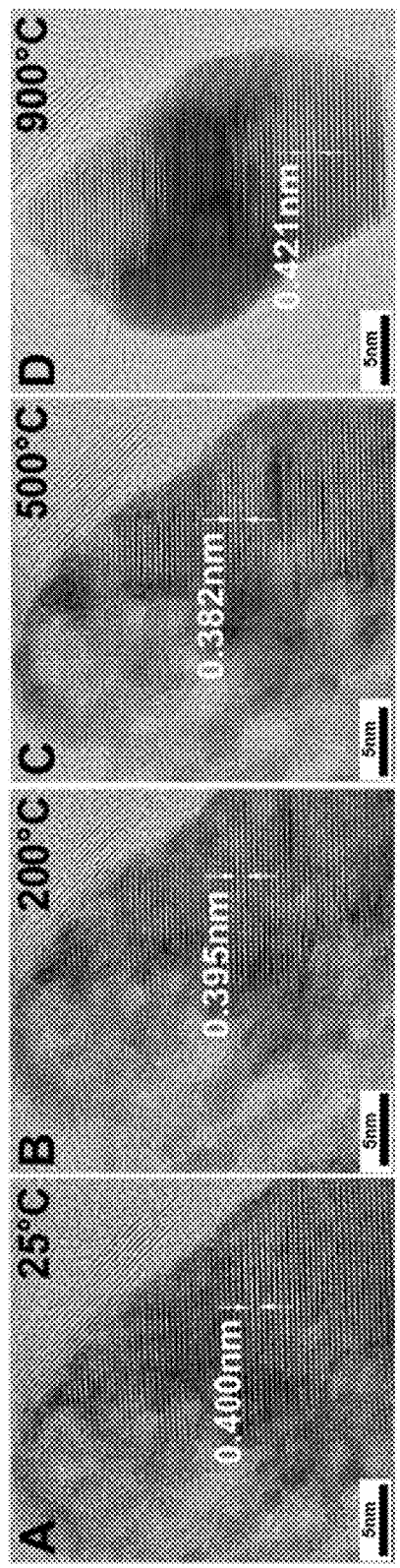
FIG. 11 is a series of images of transmission electron micrographs of $OsB_2$ particles at (a) 25° C., (b) 200° C., (c) 500° C., and (d) 900° C.

The high temperature stability of the hexagonal OsB$_2$ was also analyzed by in situ TEM, wherein the microstructural features of the hexagonal OsB$_2$ were investigated. The TEM images of a hexagonal OsB$_2$ particle after high energy ball milling are shown in FIG. 11, where the evolution of the structure can be seen as the particle is heated. It was surprising to see that the width of the lattice fringes of the OsB$_2$ particle decreased upon heating from RT to 500° C., but increased at 900° C. as would normally be expected because of the thermal expansion of the sample. In addition to such microstructural features as narrowing or broadening of the lattice planes upon heating, a significant coarsening of the particles occurred upon heating to 900° C. in vacuum in the microscope column.

Figure 12:
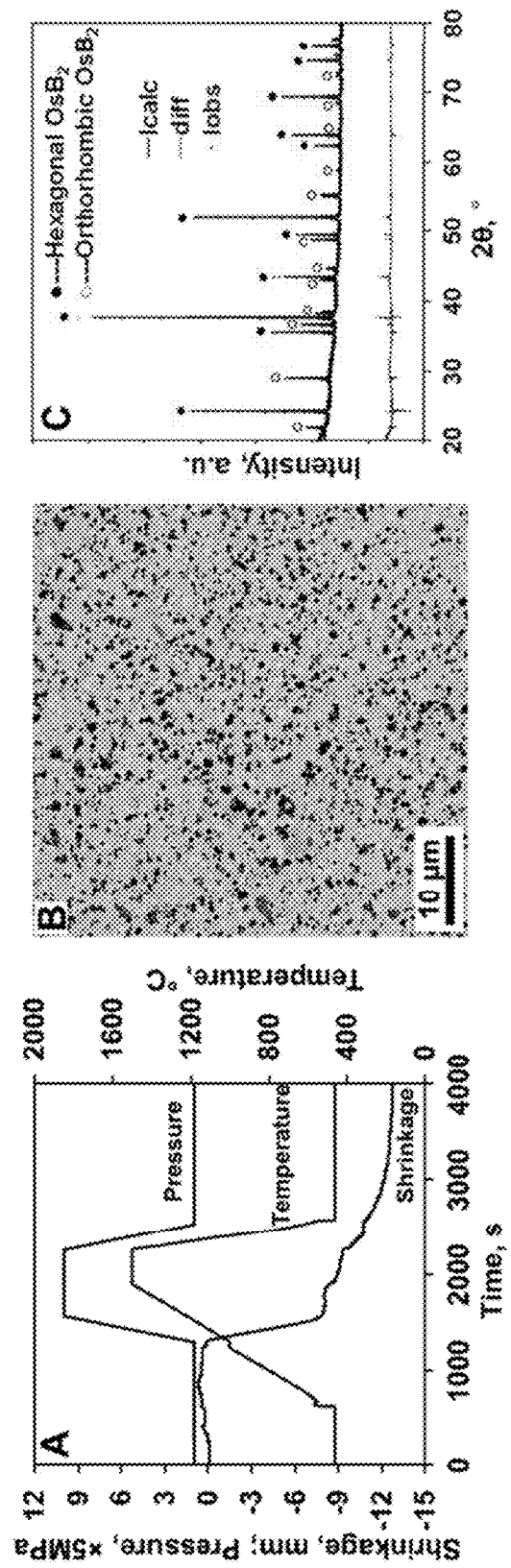
FIG. 12 is a graphical representation of: sintering plots of $OsB_2$ by SPS (FIG. 12a); an image of a SEM micrograph of polished surface of SPSed $OsB_2$ (FIG. 12b); a graphical representation of a room temperature XRD pattern of $OsB_2$ after SPS consisting of 80% hexagonal and 20% orthorhombic phases (FIG. 12c). No other phases, such as tungsten carbide or crystalline boron, were detected by XRD.

The hexagonal OsB$_2$ powder was also sintered to decrease the porosity of the powder and create a densified, bulk form of the hexagonal OsB$_2$ powder. More specifically, the hexagonal OsB$_2$ powder was subjected to a high temperature Spark Plasma Sintering (SPS) process at 1550° C. for 5 minutes of dwell time at 50 MPa applied pressure. However, XRD analysis of the sintered OsB$_2$ suggested that, after sintering, the OsB$_2$ comprised a mixture of 80 wt % hexagonal OsB$_2$ and 20 wt % orthorhombic porous OsB$_2$ (FIG. 12c). Slight change in lattice parameters also found that a=b=2.916 Å, c=7.376 Å. From the sintering shrinkage data (FIG. 12a) taken during the sintering process, it was clear that densification did not finish at the 1550° C. sintering temperature, which caused a porous material (see FIG. 12b) to be formed comprising a mixture of hexagonal and orthorhombic OsB$_2$. Lower sintering temperatures (about 1400 to 1450° C.) and shorter time (about 3 minutes) would likely prevent the re-formation of orthorhombic OsB$_2$ and higher pressure (about 70 MPa) to promote the densification of sintered material.

Figure 13:
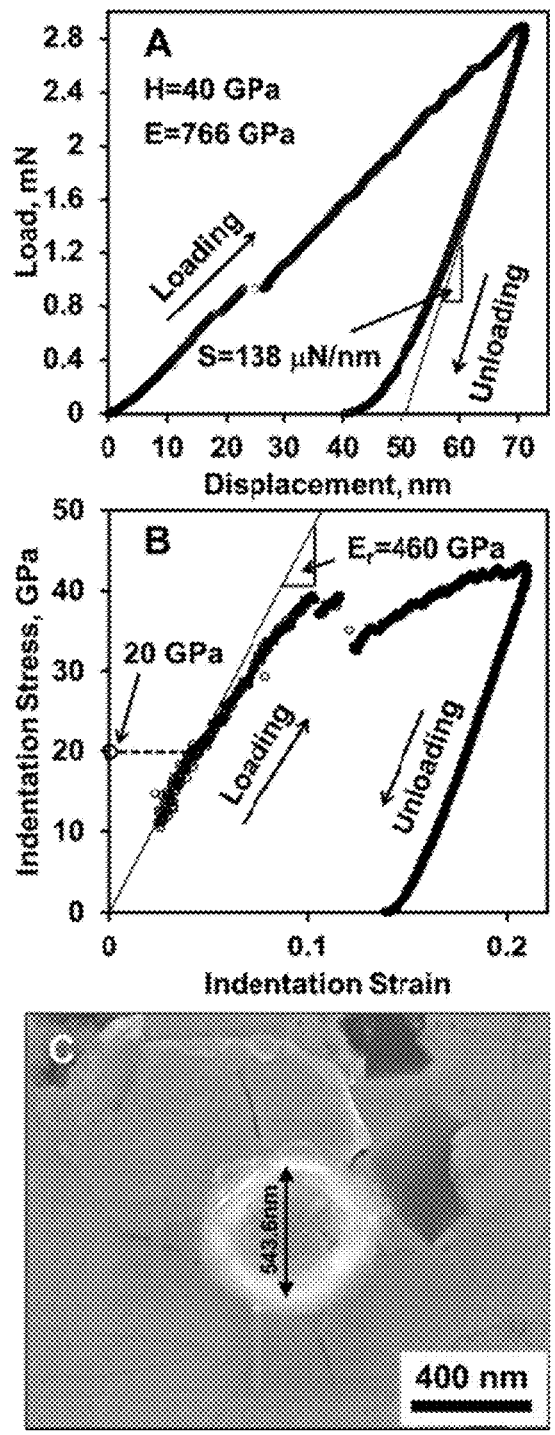
FIG. 13 is a graphical representation of: a load-displacement plot for the presently disclosed and/or claimed hexagonal $OsB_2$ (FIG. 13a); indentation stress-strain plots obtained using conical indenter in displacement control mode (FIG. 13b); and a SEM micrograph of the impression of the nanoindentation (FIG. 13c).

Hardness and Young's modulus measurements were then taken on the sintered hexagonal OsB$_2$ with Hysitron® (Minneapolis, Minn.) nanoindenter equipped by a conical indenter with a tip radius of 0.222 μm. The Young's modulus were calculated by Oliver and Pharr's method from the unloading part of load-displacement plot depicted in FIG. 13a and FIG. 13b, with a standard deviation of less than 10%. As no measured Poisson's ratio was available for the new OsB$_2$ phase, 0.18 value was used for the calculation of Young's modulus. If Poisson's ratio was assumed to be 0.27, as it was reported for orthorhombic OsB$_2$, Young's modulus would be equal to 561±38 GPa. By definition, hardness is determined as an applied load divided by the indentation contact area, and therefore the value can be estimated using the radius of impression, measured from SEM micrographs, if the maximum load is known. As such, the hardness measurements were also calculated using a Hysitron nanoindenter (with loading of 8 mN) and SEM micrographs of the resulting impressions (FIG. 13c). In the case of a loading of 8 mN and a resultant impression diameter of 543.6 nm (FIG. 13c), the hardness was about 34 GPa.

From the above description, it is clear that the inventive concept(s) disclosed herein is well adapted to carry out the object and to attain the advantages mentioned herein as well as those inherent in the inventive concept(s) disclosed herein. While exemplary embodiments of the inventive concept(s) disclosed herein have been described for purposes of this disclosure, it will be understood that numerous changes may be made which will readily suggest themselves to those skilled in the art which are accomplished without departing from the scope of the inventive concept(s) disclosed herein and defined by the appended claims.

What is claimed is:

1. A composition, comprising OsB$_2$ having a hexagonal lattice structure, wherein the OsB$_2$ comprises a P6$_3$/mmc space group.

2. The composition of claim 1, wherein the hexagonal $OsB_2$ comprises unit cell dimensions of:
  (i) a=b=2.911 Å and c=7.392 Å; and
  (ii) α=β=90°, γ=120°.

3. The composition of claim 1, wherein the hexagonal $OsB_2$ is in the form of a powder.

4. The composition of claim 3, wherein the hexagonal $OsB_2$ is stable after annealing the hexagonal $OsB_2$ for at least 6 days at a temperature of at least 1050° C.

5. The composition of claim 3, wherein the hexagonal $OsB_2$ is stable at temperatures in a range of from about −223° C. to about 875° C.

6. The composition of claim 5, wherein the hexagonal $OsB_2$ undergoes negative thermal expansion at a temperature range of from about 300° C. to about 500° C. in the direction of the a lattice parameter.

* * * * *